(12) United States Patent
Grivna

(10) Patent No.: US 12,132,086 B2
(45) Date of Patent: *Oct. 29, 2024

(54) SEMICONDUCTOR DEVICES WITH DISSIMLAR MATERIALS AND METHODS

(71) Applicant: SEMICONDUCTOR COMPONENTS INDUSTRIES, LLC, Scottsdale, AZ (US)

(72) Inventor: Gordon M. Grivna, Mesa, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/479,630

(22) Filed: Oct. 2, 2023

(65) Prior Publication Data

US 2024/0030293 A1 Jan. 25, 2024

Related U.S. Application Data

(60) Continuation of application No. 18/062,152, filed on Dec. 6, 2022, now Pat. No. 11,810,954, which is a division of application No. 16/948,491, filed on Sep. 21, 2020, now Pat. No. 11,563,091.

(51) Int. Cl.
*H01L 29/165* (2006.01)
*H01L 21/285* (2006.01)
*H01L 29/06* (2006.01)
*H01L 49/02* (2006.01)

(52) U.S. Cl.
CPC ...... *H01L 29/165* (2013.01); *H01L 21/28562* (2013.01); *H01L 28/55* (2013.01); *H01L 28/60* (2013.01); *H01L 29/0688* (2013.01); *H01L 28/40* (2013.01)

(58) Field of Classification Search
CPC ... H01L 28/60; H01L 29/0688; H01L 29/165; H01L 21/28562
See application file for complete search history.

(56) References Cited

U.S. PATENT DOCUMENTS

| 7,087,925 | B2 | 8/2006 | Grivna |
| 7,276,425 | B2 | 10/2007 | Averett et al. |
| 11,563,091 | B2 * | 1/2023 | Grivna ................. H01L 29/165 |
| 2004/0000686 | A1 | 1/2004 | Houston |
| 2014/0203400 | A1 * | 7/2014 | Kobrinsky ............. H10B 61/10 |
| | | | 257/532 |

OTHER PUBLICATIONS

Fengwen Mu et al., "Wafer bonding of SiC-SiC and SiC-Si by modified suface activated bonding method", ICEP-IAAC 2015 Proceedings.

\* cited by examiner

*Primary Examiner* — Jose R Diaz
(74) *Attorney, Agent, or Firm* — Kevin B. Jackson

(57) ABSTRACT

A method of manufacturing an electronic device includes providing a work piece comprising a first material, a first side, a second side opposite to the first side, and a first CTE. The method includes providing recesses extending into the work piece from the first side and comprising a pattern. The method includes providing a second material comprising a second CTE within the recesses and over the first material between the recesses. The method includes providing a third material comprising a third CTE over one of the second side or the second material. The third CTE and the second CTE are different than the first CTE.

20 Claims, 10 Drawing Sheets

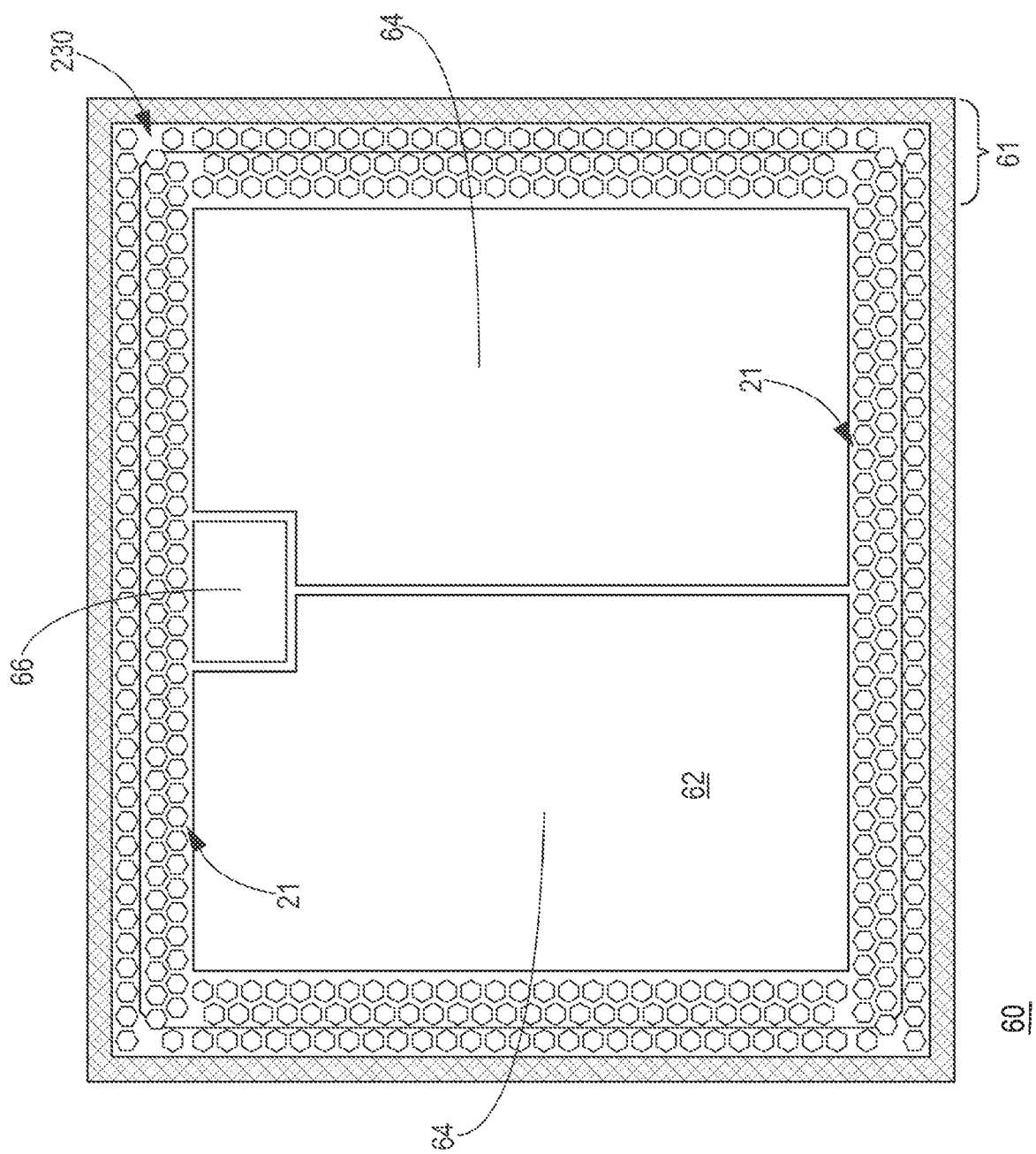

SEMICONDUCTOR DEVICES WITH DISSIMLAR MATERIALS AND METHODS

CROSS-REFERENCE TO RELATED APPLICATIONS

This application is a continuation application of co-pending U.S. patent application Ser. No. 18/062,152 filed on Dec. 6, 2022 and issued as U.S. Pat. No. 11,810,954 on Nov. 7, 2023, which is a divisional application of pending U.S. patent application Ser. No. 16/948,491 filed on Sep. 21, 2020 and issued as U.S. Pat. No. 11,563,091 on Jan. 24, 2023, which are hereby incorporated by reference and priority thereto for common subject matter is hereby claimed.

TECHNICAL FIELD

The present disclosure relates, in general, to electronics and, more particularly, to semiconductor device structures and methods of forming semiconductor devices.

BACKGROUND

Prior semiconductor devices and methods for forming semiconductor devices are inadequate, for example resulting in excess cost, inadequate integration, decreased reliability, relatively low performance, or dimensions that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIG. 6 illustrates a top plan view of a semiconductor device in accordance with the present description;

Figure 1A:
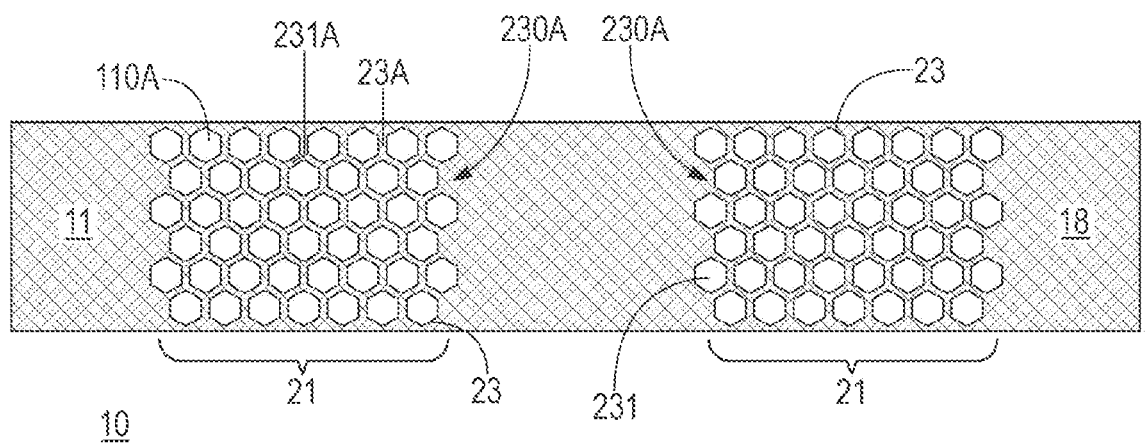
FIGS. 1A and 1B illustrate respectively a top plan view and a cross-sectional view of a semiconductor device at a step of fabrication in accordance with the present description.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

For simplicity and clarity of the illustration, elements in the figures are not necessarily drawn to scale, and the same reference numbers in different figures denote the same elements. Additionally, descriptions and details of well-known steps and elements are omitted for simplicity of the description.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

Although the semiconductor devices are explained herein as certain N-type conductivity regions and certain P-type conductivity regions, a person of ordinary skill in the art understands that the conductivity types can be reversed and are also possible in accordance with the present description, taking into account any necessary polarity reversal of voltages, inversion of transistor type and/or current direction, etc.

In addition, the terminology used herein is for the purpose of describing particular examples only and is not intended to be limiting of the disclosure. As used herein, the singular forms are intended to include the plural forms as well, unless the context clearly indicates otherwise.

As used herein, "current-carrying electrode" means an element of a device that carries current through the device, such as a source or a drain of an MOS transistor, an emitter or a collector of a bipolar transistor, or a cathode or anode of a diode, and a "control electrode" means an element of the device that controls current through the device, such as a gate of a MOS transistor or a base of a bipolar transistor.

The term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

The terms "comprises", "comprising", "includes", and/or "including", when used in this description, are open ended terms that specify the presence of stated features, numbers, steps, operations, elements, and/or components, but do not preclude the presence or addition of one or more other features, numbers, steps, operations, elements, components, and/or groups thereof.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

Although the terms "first", "second", etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

It will be appreciated by one skilled in the art that words, "during", "while", and "when" as used herein related to circuit operation are not exact terms that mean an action takes place instantly upon an initiating action but that there may be some small but reasonable delay, such as propagation delay, between the reaction that is initiated by the initial action. Additionally, the term "while" means a certain action occurs at least within some portion of a duration of the initiating action.

The use of word "about", "approximately", or "substantially" means a value of an element is expected to be close to a state value or position. However, as is well known in the art there are always minor variances preventing values or positions from being exactly stated.

Unless specified otherwise, as used herein, the word "over" or "on" includes orientations, placements, or relations where the specified elements can be in direct or indirect physical contact.

Unless specified otherwise, as used herein, the word "overlapping" includes orientations, placements, or relations where the specified elements can at least partly or wholly coincide or align in the same or different planes.

It is further understood that the examples illustrated and described hereinafter suitably may have examples and/or may be practiced in the absence of any element that is not specifically disclosed herein.

DETAILED DESCRIPTION OF THE DRAWINGS

Material science is an important aspect of semiconductor device design and processing. Stress and thermal expansion mismatch between dissimilar materials that are placed or stacked together in advanced semiconductor structures can restrict device integration and performance capabilities for such structures. Examples of semiconductor devices where these issues exist include, but are not limited to, Metal-Insulator-Metal (MIM) capacitor structures on semiconductor materials, such as barium strontium titanate (BST) MIM capacitors on silicon; and heterojunction semiconductor materials, such as IV-IV semiconductor materials including silicon-carbide (SiC). More particularly, BST MIM capacitors are typically formed on alumina substrates instead of more cost-effective silicon because alumina has a coefficient of thermal expansion (CTE) closer to that of BST than silicon. Silicon carbide has a CTE about 40% greater than that of silicon. This large mismatch in CTE together with the high processing temperatures required for SiC has restricted the ability to manufacture SiC devices on lower cost substrates, such as silicon. In addition, the large mismatch in CTE has caused device failures caused by, for example, metal delamination, shifting, and/or cracking.

In general, the present examples relate to semiconductor device structures and methods of making semiconductor devices that are configured to compensate for stress and CTE mismatch between materials that are placed or stacked together. The structures and methods are adaptable or tunable in accordance with the degree of CTE mismatch between the materials used in the structure. In some examples, recessed structures are formed in a pattern on a substrate and refilled with one or more dissimilar materials selected to resist or reduce susceptibility to shear force. In other examples, the filled recessed structure is a continuous recess region that is filled with a fill material, and portions of the substrate dispersed in a pattern within the filled recess.

In accordance with the present description, the filled recessed structures are configured to exhibit characteristics of the materials used in the stack. The quantity, spacing, and dimensions of the recesses and the fill material type enable tuning and reduction of the stress and CTE mismatch. In some examples, the recessed structure is provided having polygonal shapes placed in, for example, a honeycomb pattern in a top plan view. In accordance with the present description, by adding the filled recessed structure in a stack of dissimilar materials, improved structure resistance to CTE mismatch is achieved.

More particularly, in an example, a semiconductor device includes a substrate comprising a first material, a first major surface, and a second major surface opposite to the first major surface, the first material having a first coefficient of thermal expansion (CTE). A filled recessed structure comprises recesses extending into the substrate and having a first pattern in a plan view, the recesses spaced apart so that part of the substrate is interposed between each of the recesses, and a second material different than the first material in the recesses and having a second CTE. A structure is at the first major surface over the filled recessed structure having a third CTE, wherein the third CTE and the second CTE are different than the first CTE. In some examples, the structure comprises a MIM capacitor. In other examples, the structure comprises a heterojunction semiconductor region. In some examples, the fill material provides a current carrying electrode for the semiconductor device.

In an example, a semiconductor device includes a substrate comprising a first material, a first major surface, and a second major surface opposite to the first major surface, the first material having a first coefficient of thermal expansion (CTE). A filled recessed structure includes a first recess filled with a second material having a second CTE, the second material contiguous with the substrate in the first recess. A structure is at the first major surface over the filled recessed structure and has a third CTE. The third CTE and the second CTE are different than the first CTE. The structure comprises one of a metal-insulator-metal (MIM) capacitor or a region of heterojunction semiconductor material. In examples, the filled recess structure includes recesses including the first recess, which extend into the substrate and having a first pattern in a plan view, the recesses are spaced apart so that part of the substrate is interposed between each of the recesses. In some examples, the pattern can be a honeycomb pattern.

In an example, a method of forming a semiconductor device includes providing a substrate comprising a first material, a first major surface, and a second major surface opposite to the first major surface. The first material having a first coefficient of thermal expansion (CTE). The method includes providing a filled recessed structure comprising recesses extending into the substrate and having a first pattern in a plan view, the recesses are spaced apart so that part of the substrate is interposed between each of the recesses; and a second material different than the first material is in the recesses and has a second CTE. The method includes providing a structure at the first major surface over the filled recessed structure having a third CTE, wherein the third CTE and the second CTE are different than the first CTE.

Other examples are included in the present disclosure. Such examples may be found in the figures, in the claims, or in the description of the present disclosure.

Figure 1B:
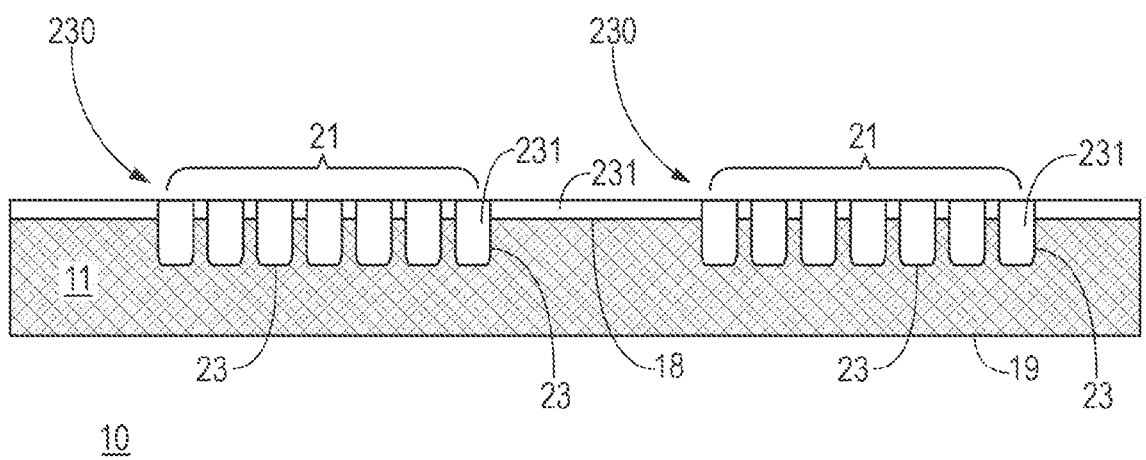

FIG. 1A illustrates an enlarged top plan view of an electronic device 10, a semiconductor device 10, semiconductor structure 10, or a stacked semiconductor structure 10 having a filled recessed structure 21 at an early step of fabrication. FIG. 1B illustrates an enlarged cross-sectional view of semiconductor device 10. In this example, semiconductor device 10 is described as a MIM capacitor stacked onto or formed onto a substrate or carrier structure. In the present example, the MIM capacitor is a BST MIM capacitor device. It is understood that the present description is relevant to other types of structures where it useful to stack or form such structures onto a carrier or substrate where the structure and the substrate comprise different materials with different CTEs or different intrinsic stress levels. The MIM capacitor is one example of such a structure.

In some examples, semiconductor device 10 comprises a substrate 11, region of semiconductor material 11, or work piece 11 having a first major surface 18 and a second major surface 19 opposite to first major surface 18. In some examples, substrate 11 can comprise silicon. In other examples, substrate 11 can comprise other semiconductor materials, semiconductor-on-insulator (all) materials, ceramic materials, or materials desired to be stacked with other materials having different thermal expansion coefficients compared to substrate 11. In other examples, substrate 11 may also be a carrier that is removed or partially removed at a later stage of fabrication, for example after high temperature processing is completed. In some examples, substrate 11 is a high resistivity silicon substrate having a resistivity in a range from about $1.5 \times 10^3$ ohm-cm to about $1 \times 10^5$ ohm-cm. In other examples, substrate 11 can include one or more doped regions or layers formed proximate to major surfaces 18 and/or 19, which can be formed using epitaxial growth techniques, ion implantation and annealing techniques, or other doping techniques as known to one of ordinary skill in the art.

In some examples, filled recessed structure 21 includes recesses 23 or trenches 23 in substrate 11 extending from major surface 18 inward into substrate 11. In some examples, recesses 23 extend only partially into substrate 11 and terminate before extending completely through substrate 11. In some examples, recesses 23 are formed in a pattern 230 configured to absorb or reduce stress in semiconductor device 10. In some examples, pattern 230 comprises a honeycomb pattern 230A as illustrated in FIG. 1A. To optimize semiconductor device 10, the shapes (including those in a top plan view and in cross-sectional views), quantity, dimensions (width and depth), pitch, and spacing of recesses 23 can be selected depending on the types of materials used for substrate 11 and of those used for the structures to be stacked over substrate 11. As illustrated in FIG. 1B, recesses 23 can have a lower surface shape that is other than square, such as rounded or partially rounded.

In addition, the location of recesses 23 can be varied including, but not limited to, configurations where: a) recesses 23 are placed in discrete locations across major surface 18 or major surface 19, b) recesses 23 are placed across substantially all of major surface 18 or major surface 19, or c) recesses 23 are placed at peripheral edge regions of major surface 18 or major surface 19. In some examples, recesses 23 can be formed at both major surface 18 and 19 in the same or different configurations. In the present example of semiconductor device 10, recesses 23 are placed at major surface 18 in regions where BST MIM capacitors will be formed. In some examples, recesses 23 have a depth in a range from about 10 microns to about 100 microns and a width from 1 micron to about microns.

Filled recessed structure 21 further includes a fill 231, fill material 231, or stress-compensating material 231 in recesses 23. In accordance with the present description, fill material 231 comprises a material that is dissimilar or different than substrate 11, although similar materials with different intrinsic stress also can be used. Such similar materials can be formed by depositing using different methods, such as deposition temperature or deposition rate. Stated differently, fill material 231 has a CTE that is different than substrate 11 and that is similar to the CTE of the structure that will be provided over substrate 11, or fill material 231 has a CTE that is between the CTE of substrate 11 and the CTE of the structure that will be provided over substrate 11. In some examples, when substrate 11 comprises silicon, fill material 231 can comprise silicon oxide (thermally grown, deposited, doped, or undoped), silicon nitride, metal nitrides, other semiconductor materials, high k dielectric materials, low k dielectric materials, other materials suitable for high temperature semiconductor processing as known to one of ordinary skill in the art, including combinations thereof. In the present example, fill material 231 can be silicon oxide, which has a CTE of $5 \times 10^{-6 \circ}$ C.$^{-1}$, substrate 11 can be silicon, which has a CTE of $2.6 \times 10^{-6 \circ}$ C.$^{-1}$, and the structure that will be formed over substrate 11 can be BST MIM capacitor structure, which has a CTE of $7.8 \times 10^{-6 \circ}$ C.$^{-1}$.

In the past, alumina substrates have been used for BST MIM capacitor structures, which have a CTE of $7.6 \times 10^{-6 \circ}$ C.$^{-1}$. Alumina substrates have a disadvantage over silicon substrates including higher costs. In the present example, silicon oxide as fill material 231 provides a fill material with CTE about half-way between substrate 11 comprising silicon and typical BST MIM capacitor structure.

Other considerations for fill material 231 include, but are not limited to, materials that: a) do not induce warpage or other unwanted stresses within semiconductor device 10, b) use standard deposition techniques, c) can be patterned using processes known to one of ordinary skill the art, d) do not introduce unwanted contamination within wafer fabrication facilities or to the structures provided over the filled recessed structure, and e) do not add excessive costs. Fill material 231 can be formed using thermal processing, chemical vapor deposition (plasma enhanced (PECVD) or low pressure (LPCVD)), atomic layer deposition (ALD), epitaxial growth techniques, sputtering, evaporation, plating, or other processing techniques as known to one of ordinary skill the art.

In some examples, fill material 231 can extend outside of recesses 23 and can overlie portions of major surface 18 as generally illustrated in FIG. 1B. In other examples, a different material can be over major surface 18 between recesses 23 that is different than fill material 231. In some examples, fill material 231 can overlie the different material at major surface 18 so that the different material is interposed between major surface 18 of substrate 11 and fill material 231 that is outside of recesses 23.

In other examples, the configuration of FIG. 1A can be reversed so that what is designated as elements 23 would become pillars 110A of substrate 11, and the region between pillars 110A would be removed as a continuous recess regions 23A, which is filled with fill material 231A. Stated differently, filled recessed structure 21 can comprise a continuous recess region 23A having pillars 110A extending upward from a lower surface of recess region 23A with fill material 231A in the recess region 23A. As illustrated in FIG. 1A, pillars 110A are dispersed within the second material. In some examples, upper tips of pillars 110A can be exposed outside of fill material 231A. Pillars 110A can have shapes similar to those described for recesses 23.

Figure 2:
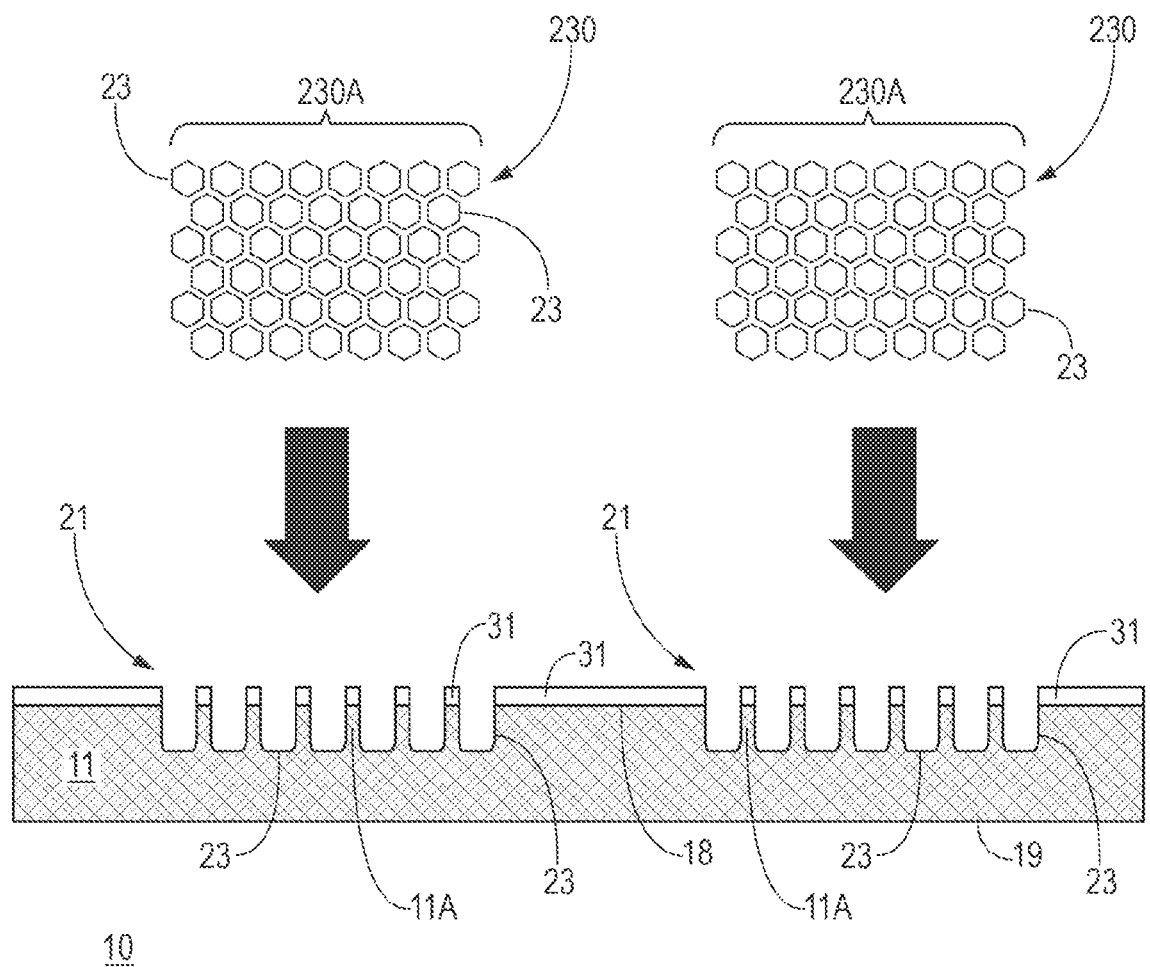
FIG. 2 illustrates a partial top plan view and a cross-sectional view of the semiconductor device of FIGS. 1A and 1B at an earlier step of fabrication in accordance with the present description.

FIG. 2 illustrates a cross-sectional view of semiconductor device 10 at earlier step in fabrication prior to that illustrated in FIG. 1B. In some examples, a dielectric 31, such as one or more dielectric layers is provided at or over major surface 18 of substrate 11. In some examples, dielectric 31 comprises a thermal oxide having a thickness in a range from about 2000 Angstroms to about 4000 Angstroms. In a next step, a photolithographic process can be used to define pattern 230 for filled recess structure 21. Such a process can include an exposed photoresist pattern that is developed to provide the desired pattern. In some examples, honeycomb pattern 230A is provided by the photolithographic process. Next, portions of dielectric 31 are removed where dielectric 31 is exposed through the pattern to expose portions of major surface 18 of substrate 11.

Next, a removal step, such as an etch step is used to form recesses 23 extending inward from major surface 18 into substrate 11. By way of example, recesses 23 can be etched using plasma etching techniques with a fluorocarbon chemistry or a fluorinated chemistry (for example, $SF_6/O_2$), or other chemistries or removal techniques as known to one of ordinary skill in the art. In accordance with the present description, portions 11A of substrate 11 remain between recesses 23. Stated differently, portions 11A of substrate 11 are interposed between recesses 23. In some examples, remaining portions of dielectric 31 over major surface 18 are left in place. In other examples, the remaining portions of dielectric 31 can be removed before subsequent processing.

Figure 3:
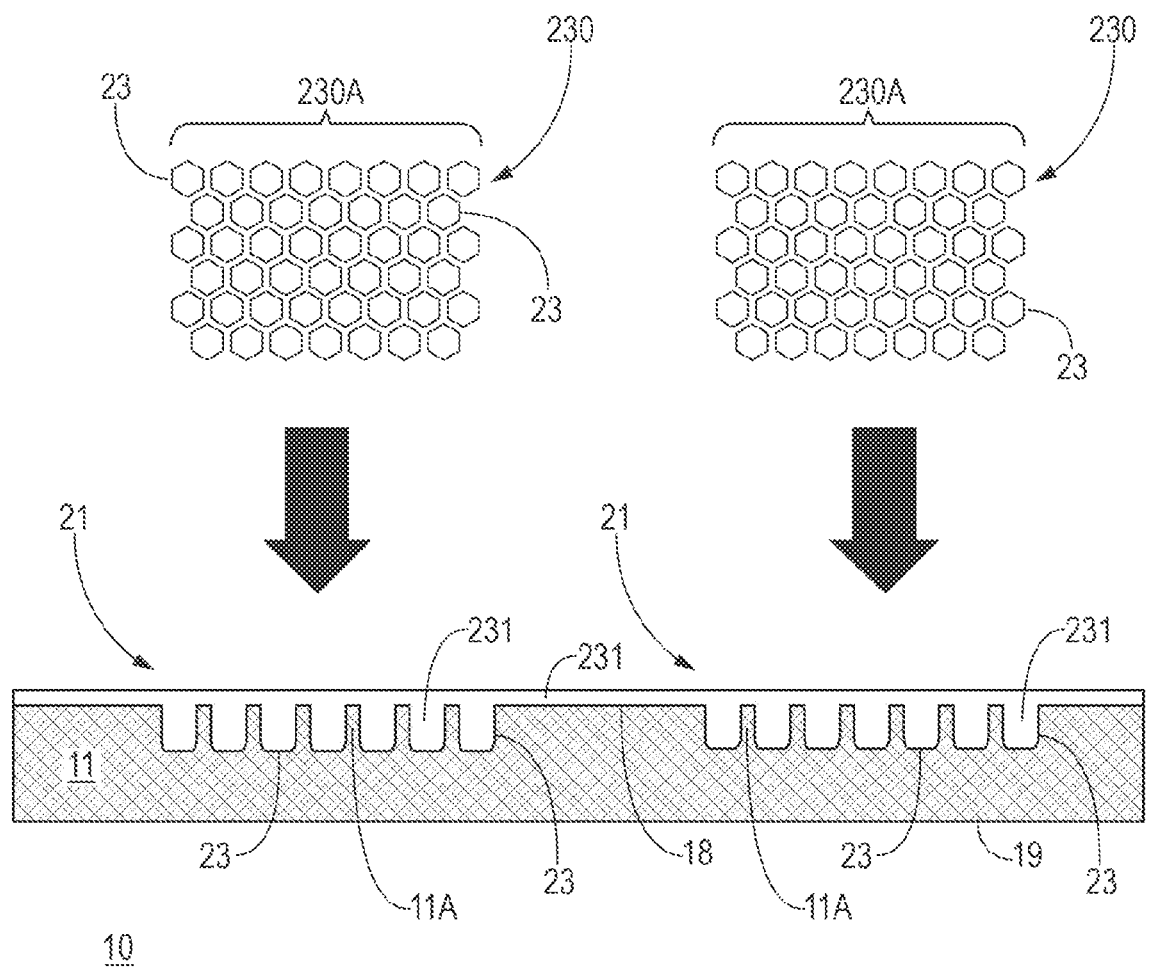
FIG. 3 illustrates a partial top plan view and a cross-sectional view of the semiconductor device of FIG. 2 at a later step of fabrication in accordance with the present description.

FIG. 3 illustrates a cross-sectional view of semiconductor device 10 after further processing. In some examples, fill material 231 is provided within recesses 23 and over major surface 18. In some examples, fill material 231 comprises a dielectric, such as a deposited oxide. In some examples, fill material is a deposited oxide formed using tetraethyl orthosilicate as a source. In some examples, the upper surface of fill material 231 is planarized using chemical mechanical processing (CMP) or other planarization techniques as known to one of ordinary skill in the art. As illustrated in FIG. 3, in some examples, a portion of fill material 231 can remain over major surface 18 outside of recesses 23. In accordance with the present description, with portions 11A of substrate 11 interposed between recesses 23, fill material 231, which is in recesses 23, is also separated by portions 11A. That is, fill material 231 is not provided as a continuous tub or region of dielectric material. In addition, the spacing between recesses 23 is chosen so that when fill material 231 comprises a thermal oxide, portions 11A are not consumed in the process so that part of portions 11A remain to preserve individual recesses 23 as illustrated in FIG. 3. In an alternate example, the area of recesses 23 and fill material can be a continuously connected tub or region of dielectric, and the spacing between recesses would comprise disconnected and district pillars of substrate 11.

Figure 4:
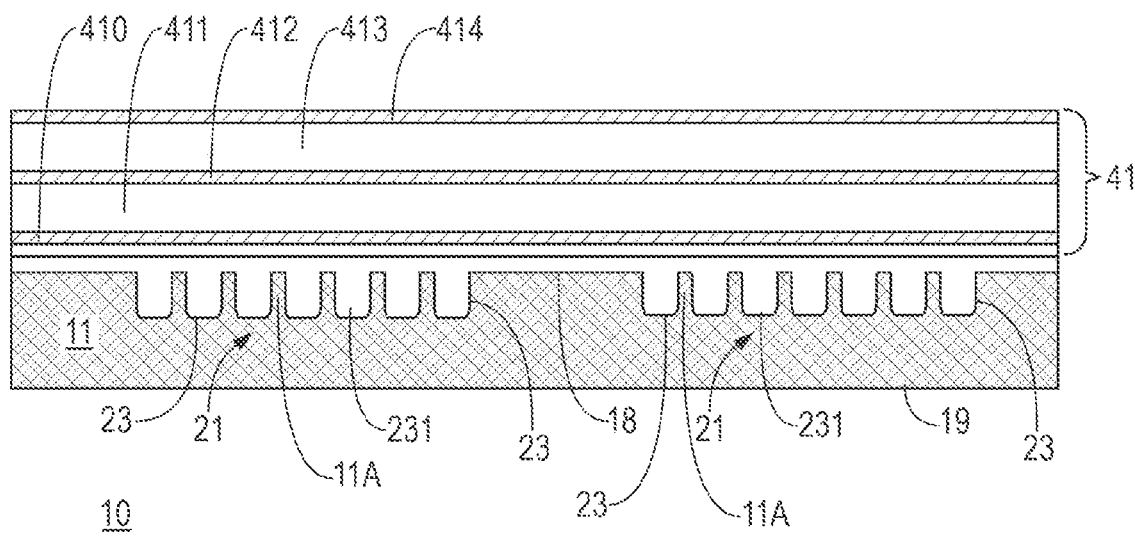
FIG. 4 illustrates a cross-sectional view of a semiconductor device at a step of fabrication in accordance with the present description.

FIG. 4 illustrates a cross-sectional view of semiconductor device 10 after additional processing. In some examples, a structure 41 or BST stack 41 is formed or stacked onto substrate 11 over filled recessed structure 21. BST stack 41 includes one or more materials that are dissimilar to the material that substrate 11 comprises. In some examples, BST stack 41 comprises a combination of conductive materials and insulative materials provided in a laminate or layered configuration. In some examples, BST stack 41 includes a first conductor 410, a first insulator 411, a second conductor 412, a second insulator 413, and third conductor 414.

In some examples, first conductor 410 can include an adhesion layer, such as a titanium layer, which can also be partially oxidized. First conductor 410 can further include a platinum layer over the titanium layer. First insulator 411 can comprise multiple layers of BST, which can include layers that are deposited and annealed before subsequent BST layers are formed. Second conductor 412 can include a layer of platinum, and second insulator 413 can comprise multiple layers of BST, which can include layers that are deposited and annealed before subsequent BST layers are formed. Third conductor 414 can comprise a layer of platinum. BST stack 41 can be formed using evaporation, sputtering, and other deposition techniques as known to one of ordinary skill in the art including combinations thereof.

Figure 5:
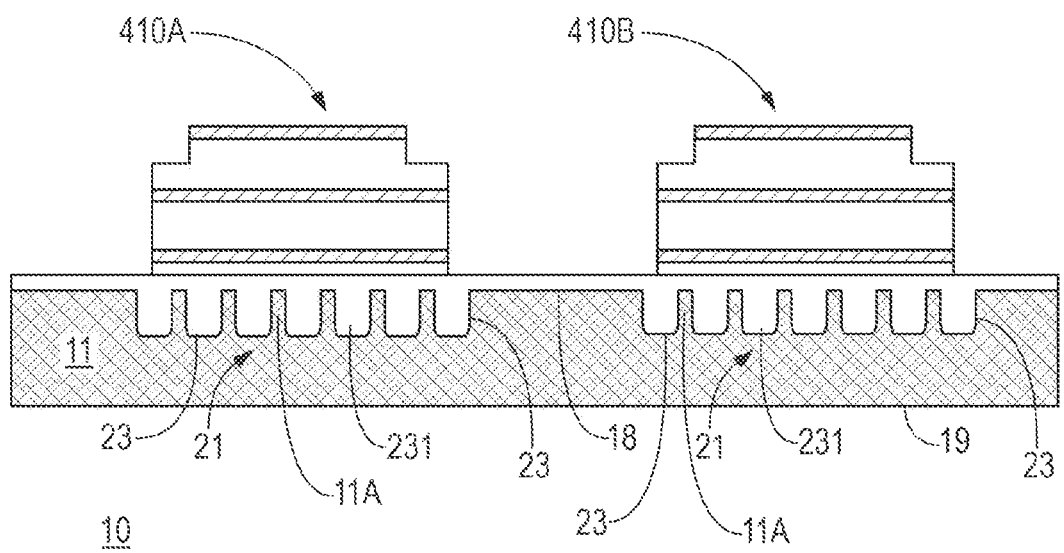
FIG. 5 illustrates a cross-sectional view of the semiconductor device of FIG. 4 at a later step of fabrication in accordance with the present description in a BST MIM capacitor example.

FIG. 5 illustrates a cross-sectional view of semiconductor device 10 after still further processing. In some examples, patterning processes can be used to pattern BST stack 41 to provide a plurality of BST MIM capacitors 410A and 410B stacked over major surface 18 of substrate 11, and over filled recessed structures 21. In some examples, one or more photolithographic steps and one or more etch steps are used to provide BST MIM capacitors 410A and 410B.

In some examples, filled recessed structures 21 can have a lateral width that is larger than the lateral width of BST MIM capacitors 410A and 410B as generally illustrated in FIG. 5. In other examples, the lateral widths can be substantially equal. In further examples, the lateral width of filled recessed structures 21 can be less than the lateral width of BST MIM capacitors 410A and 410B. An example of such an embodiment can be when the CTE mismatch between BST stack 41 and substrate 11 is not too large.

As described previously, in some examples BST MIM capacitors 410A and 410B can have a CTE of about $7.8\times 10^{-6\circ}$ C.$^{-1}$, fill material 231 comprising silicon oxide can have a CTE of about $5\times 10^{-6\circ}$ C.$^{-1}$ and substrate 11 comprising silicon can have a CTE of $2.6\times 10^{-6\circ}$ C.$^{-1}$. In accordance with the present description, filled recess structures 21 having fill material 231 within recesses 23 functions to compensate for stresses and CTE mismatch between BST MIM capacitors 410A/410B and substrate 11 that would exist and cause reliability/performance issues for semiconductor device 10 in the absence of filled recess structures 21. It was found through experimentation that the present structure provided significantly reduced delamination of the BST MIM capacitor structures compared to prior structures using silicon substrates without filled recessed structures as described herein.

Figure 7A:
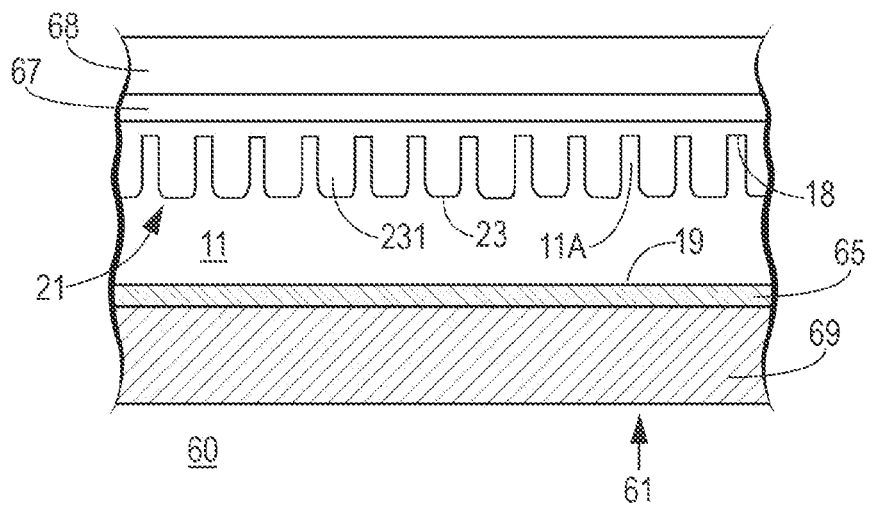
FIGS. 7A, 7B, and 7C illustrate partial cross-sectional view of the semiconductor device of FIG. 6 in accordance with example embodiments.
Figure 7B:
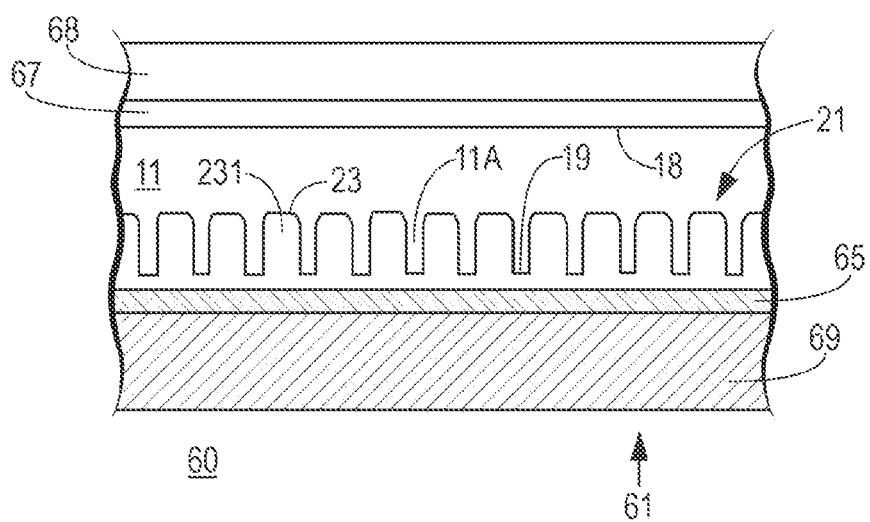
Figure 7C:
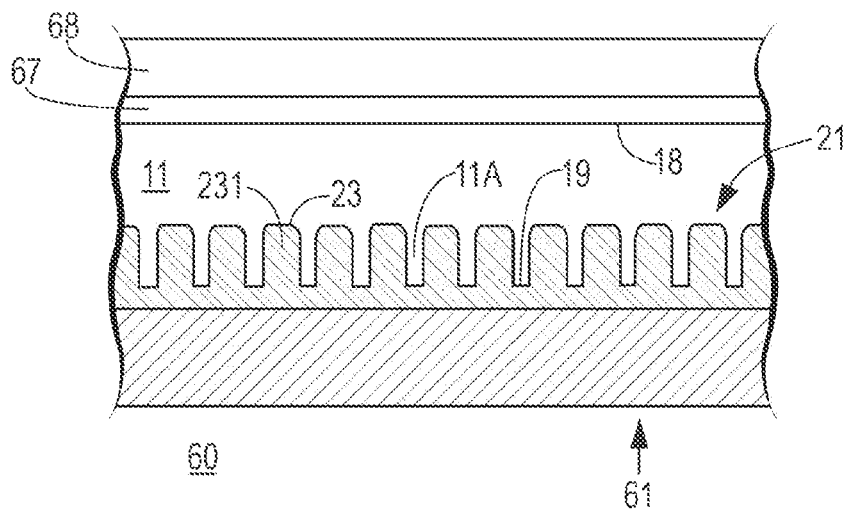

FIG. 6 illustrates a top plan view of an electronic device 60, a semiconductor device 60, or a stacked semiconductor structure 60 having a filled recessed structure 21 in accordance with the present description. FIG. 7A illustrates a partial cross-sectional view of semiconductor device 60 in accordance with an example; FIG. 7B illustrates a partial cross-sectional view of semiconductor device 60 in accordance with an example, and FIG. 7C illustrates a partial cross-sectional view of semiconductor device 60 in accordance with an example.

In accordance with the present example, filled recessed structure 21 is provided at an outer perimeter 61 of semiconductor device 60. More particularly, filled recessed structure 21 is provided to surround or partially surround an active area 62 of semiconductor device 60. In some examples, semiconductor device 60 is configured as a power semiconductor device, such as a metal-oxide-semiconductor field effect transistor (MOSFET) device having current carrying electrodes 64 and a control electrode 66 at a top side of semiconductor device 60. In some examples, another current carrying electrode 65 is provided at a lower side of semiconductor device 60 as illustrated in FIGS. 7A-7C. In some examples, filled recessed structure 21 is provided at perimeter 61 to provide a pinning effect that reduces the movement of stacked dissimilar materials proximate to the edge of semiconductor device 60. Examples of such stacked dissimilar materials include a dielectric 67 and an insulating packaging material 68 illustrated in FIGS. 7A-7C. Other examples of such stacked dissimilar materials can include a package substrate 69 as illustrated in FIGS. 7A-7C, which can be a lead frame substrate, a printed circuit board substrate, a redistribution layer (RDL) substrate, other types of coreless substrates, a permanent core substrate, or other types of package substrates as known to one of ordinary skill in the art, and substrate 11 of semiconductor device 60, which can comprise a semiconductor material including silicon. In some examples, insulating packaging material 68 can be a polymer based composite material, such as epoxy resin with filler, epoxy acrylate with filler, or polymer with a proper filler. In some examples, insulating packaging material 68 comprises an epoxy mold compound and can be formed using transfer or injection molding techniques.

In the example of FIG. 7A, filled recessed structure 21 is provided at perimeter 61 adjacent to major surface 18 of substrate 11 of semiconductor device 60, which in the present example is a surface opposite to or distal to package substrate 69. Similar to semiconductor device 10, filled recessed structure 21 comprises recesses 23, which can be formed in a pattern 230 as illustrated in FIG. 5, such as honeycomb pattern 230A as illustrated in FIG. 1A. Fill material 231 is within recesses 23 and in some examples, extends out of recesses 23 and overlaps portions of major surface 18. In this example, filled recessed structure 21 can function to restrict movement of dielectric 67 and insulating packaging material 68 proximate to perimeter 61. In the present example, fill material 231 can comprise fill materials as described previously.

In the example of FIG. 7B, filled recessed structure 21 is provided at perimeter 61 adjacent to major surface 19 of substrate 11 of semiconductor device 60, which is proximate to package substrate 69. Similar to semiconductor device 10, filled recessed structure 21 comprises recesses 23, which can be formed in a pattern 230 as illustrated in FIG. 6, such as honeycomb pattern 230A as illustrated in FIG. 1A. Fill material 231 is within recesses 23 and in some examples, extends out of recesses 23 and overlaps portions of major surface 19. In this example, filled recessed structure 21 can function to restrict movement of substrate 11 and package substrate 69 or the movement of dielectric 67 and insulating packaging material 68. In the present example, fill material 231 can comprises fill materials as described previously. In some examples, the example of FIG. 7A can be combined with the example of FIG. 7B.

The example of FIG. 7C is similar to the example of FIG. 7B except fill material 231 can comprise the material used for current carrying electrode 65, a die attach material, a solder material, or combinations of such materials; or can comprise fill materials as described previously. In this example, filled recessed structure 21 can function to restrict movement of substrate 11 and package substrate 69 or the movement of dielectric 67 and insulating packaging material 68. In some examples, the example of FIG. 7A can be combined with the example of FIG. 7C.

Turning now to FIGS. 8-14, a structure and method is described for where the stacked structure comprises a heterojunction semiconductor material. In the present example, a heterojunction semiconductor device is described using a silicon-carbide (SiC) region or structure stacked onto a silicon substrate with a filled recessed structure filled with a material comprising SiC. Trends in the semiconductor industry suggest that, based on technical and commercial factors and challenges, the development of a SiC film or structure on silicon base substrate is a promising approach for SiC devices to become more widely accepted in the industry. A main technical challenge in the development of such structures is the relatively large mismatch in crystal-lattice constants and CTEs.

Figure 8:
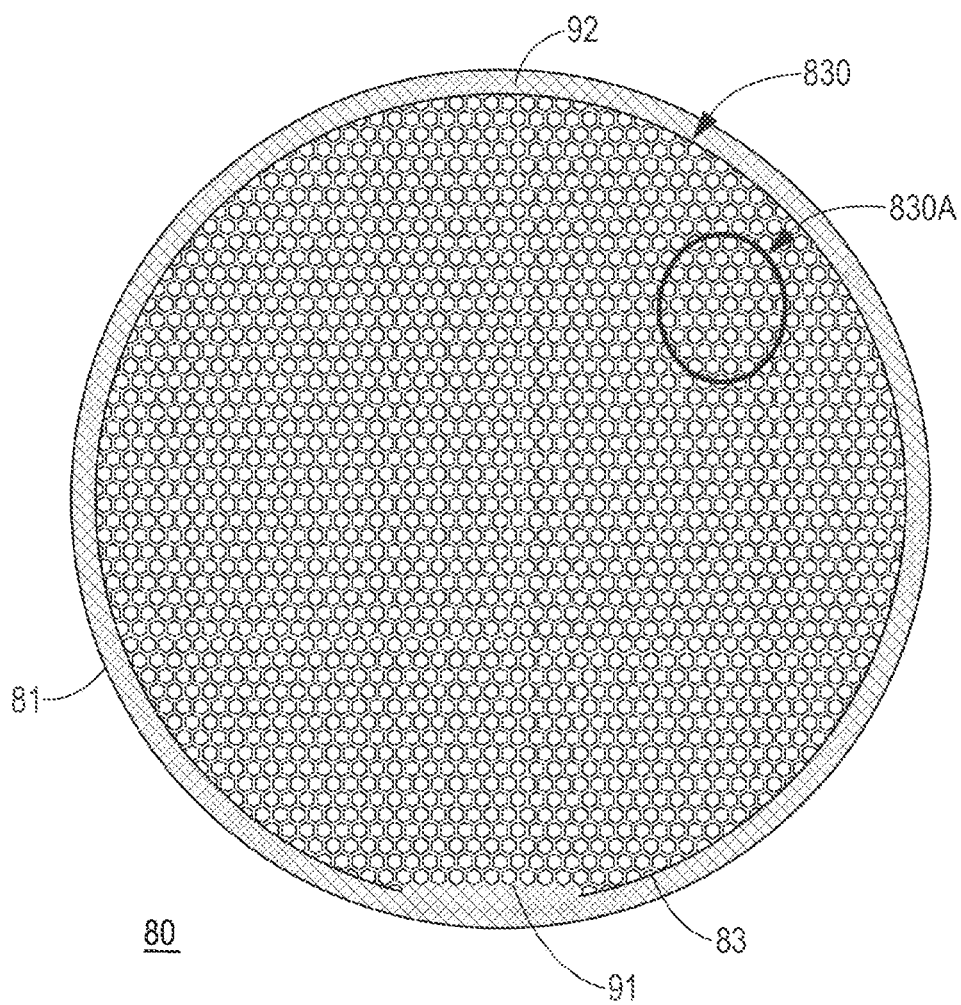
FIG. 8 illustrates a top plan view of a semiconductor structure in accordance with the present description at a step in fabrication in accordance with the present description.
Figure 9:
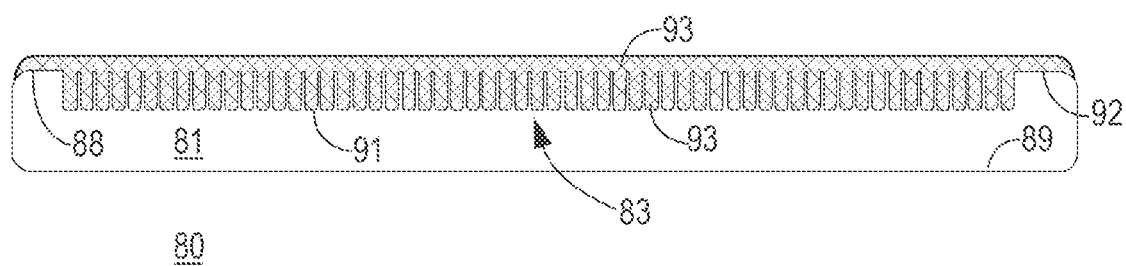
FIG. 9 illustrates a cross-sectional view of the semiconductor structure of FIG. 8.

FIG. 8 illustrates a top plan view of an electronic structure 80 or a semiconductor structure 80 in accordance with the present description. FIG. 9 illustrates a cross-sectional view of semiconductor structure 80. Semiconductor structure 80 comprises a substrate 81, work piece 81, or wafer 81 and a filled recessed structure 83. In the present example, substrate 81 comprises silicon, but it is understood that other materials can be used in other examples. Substrate 81 includes a major surface 88 and a major surface 89, which is opposite to major surface 88.

Filled recessed structure 83 comprises recesses 91 or trenches 91 extending from major surface 88 of substrate 81 inward into substrate 81. Recesses 91 are spaced apart leaving portions of substrate 81 interposed between adjacent recesses 91. In some examples, recesses 91 are provided in a pattern 830, such as a honeycomb pattern 830A. In some examples, pattern 830 extends to cover substantially all of major surface 88 leaving a small area at a perimeter 92 of substrate 81 absent recesses 91. Filled recessed structure 83 further includes a fill material 93 in recesses 91. In some examples, fill material 93 extends out of recesses 91 and overlaps onto major surface 88. In some examples, fill material 93 forms a continuous film structure that extends substantially across all of major surface 88 including perimeter 92. Recesses 91 can be formed using similar processes as described previously with recesses 23.

In accordance with the present example, fill material 93 comprises the same or similar material as the structure to be stacked onto or formed onto substrate 81. That is, when the structure comprises a heterojunction semiconductor material, the fill material comprises a heterojunction semiconductor material. Specifically, in the present example, fill material 93 comprises SiC, which can be deposited over major surface 88 using low-pressure chemical vapor deposition (LPCVD) or other deposition techniques as known to one of ordinary skill the art. The CTE mismatch between SiC and silicon ($3.7 \times 10^{-6}$ C.$^{-1}$ versus $2.6 \times 10^{-6}$ C.$^{-1}$) is not as pronounced as the CTE mismatch between BST and silicon; however, SiC devices require higher temperature processing than BST MIM capacitors (e.g., 1300° C. versus 600° C.). In some examples, it was observed that the higher temperature processing requires a closer CTE balance between a region of SiC material 102 (illustrated in FIG. 12)

or the structure added subsequently to substrate 81. That is the CTE of the structure to be added is similar to the CTE of the fill material, which is different than the CTE of substrate 81. In some examples, the depth of recesses 91 is greater compared to the depth of recesses 23 described previously. In some examples, the depth of trenches 91 can be in a range from about 40 microns to about 200 microns.

In addition to SiC, in some examples fill material 93 can comprise an oxide, a polycrystalline semiconductor material, such as polysilicon, or combinations thereof including combinations with SiC. In accordance with the present description, when fill material 93 comprises SiC, a post deposition anneal in an inert atmosphere can be used at a temperature of about 1600° C. with anneal time adjusted to balance the resulting stress. In some examples, fill material 93 can be doped with a P-type conductivity dopant (e.g., boron) or an N-type conductivity dopant (e.g., phosphorous, arsenic, or antimony). In other examples, fill material 93 can comprise another heterojunction semiconductor material that has a CTE close to the CTE of the structure to be stacked onto substrate 81.

Figure 10:
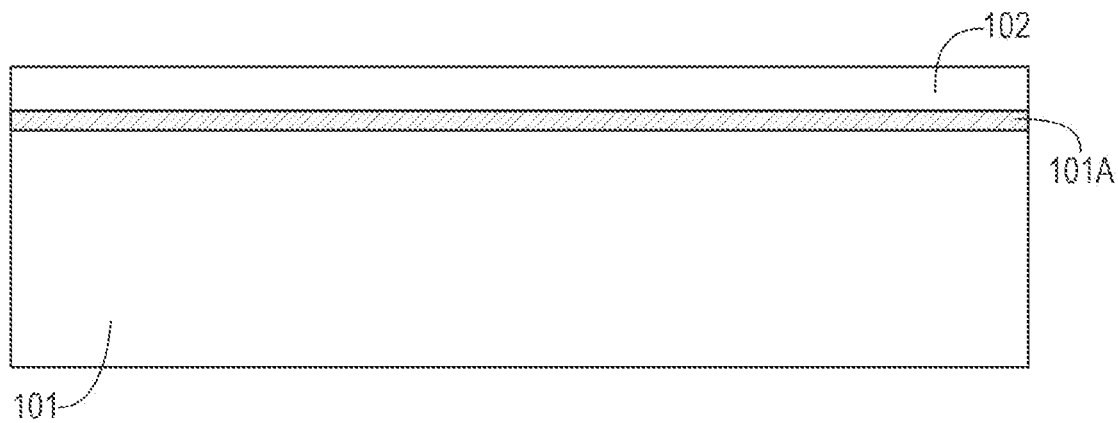
FIG. 10 illustrates a cross-sectional view of a silicon carbide (SiC) ingot for use with the semiconductor structure of FIGS. 8 and 9.

FIG. 10 illustrates a cross-sectional view of a SiC ingot 101. One process for providing a SiC wafer for semiconductor devices is the Kabra® process available from DISCO Corporation of Tokyo, Japan. In the Kabra process, a SiC ingot (e.g., SiC ingot 101) is exposed to continuous vertical laser irradiation at a specified depth to provide a separation region 101A that defines a region of SiC material 102, a heterojunction semiconductor structure 102, or a SiC structure 102.

Figure 11:
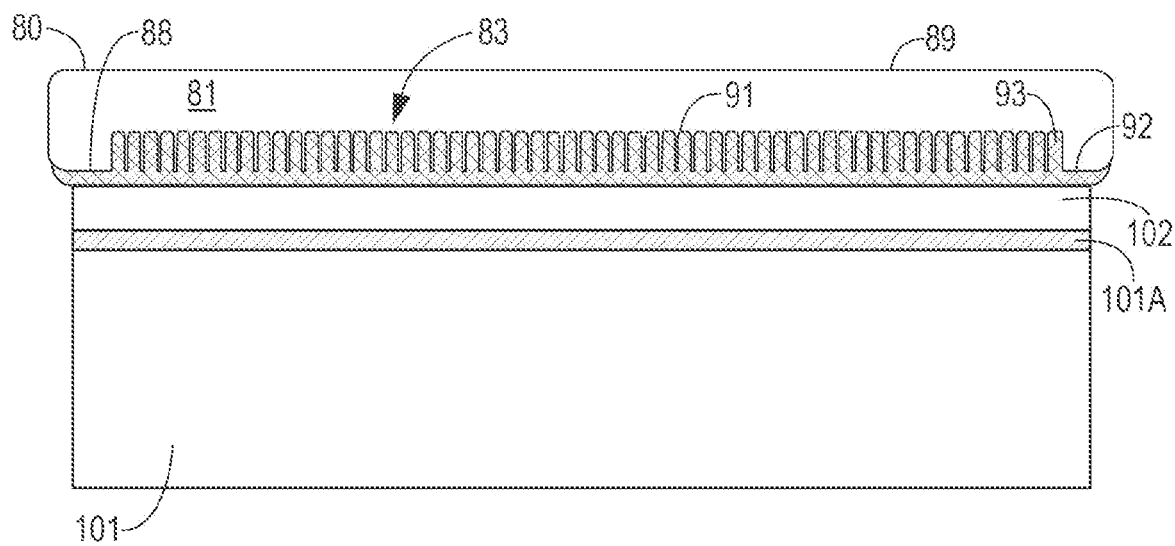
FIG. 11 illustrates a cross-sectional view of the semiconductor structure of FIGS. 8 and 9 at a later step in fabrication in accordance with the present description.
Figure 12:
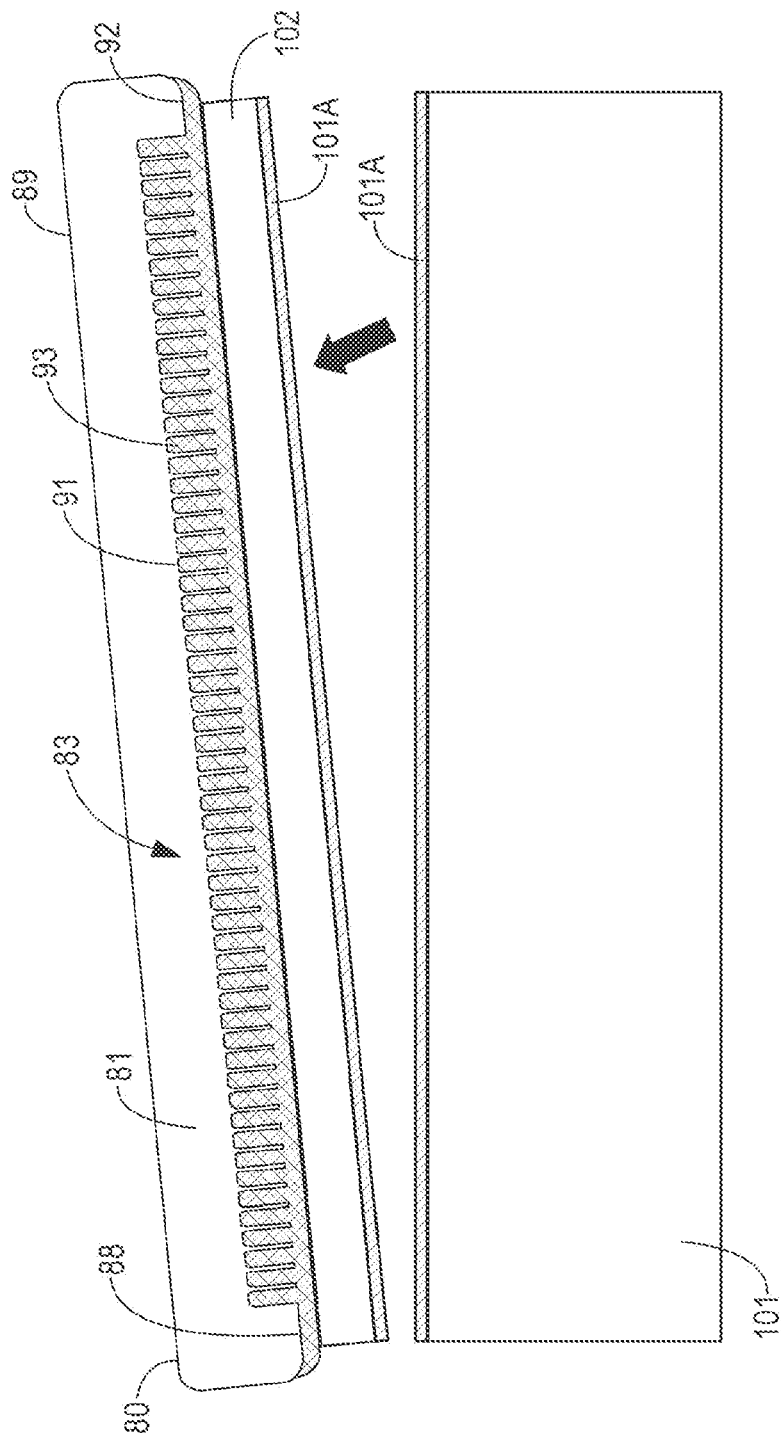
FIG. 12 illustrates a cross-sectional view of the semiconductor structure of FIGS. 8 and 9 and still later embodiment in a SiC structure example in accordance with the present description.

FIG. 11 illustrates a cross-sectional view of semiconductor structure 80 after further processing. In some examples, substrate 81 is bonded to region of SiC material 102 using wafer-to-wafer bonding. Stated another way, region of SiC material 102 can be stacked onto substrate 81 adjacent to filled recessed structure 83 using a bonding process. Specifically, fill material 93 over major surface 88 of substrate 81 can be bonded to region of SiC material 102 so that fill material 93 is interposed between substrate 81 and region of SiC material 102. In some examples, region of SiC material 102 and fill material 93 can be planarized before the bonding step using, for example, chemical mechanical planarization (CMP) techniques to achieve a root-mean-square (rms) roughness of less than about 0.2 nm. In some examples, surface activation bonding can then be used under vacuum conditions to bond substrate 81 to region of SiC material 102 as known to one of ordinary skill the art. Next, substrate 81 with region of SiC material 102 is removed from SiC ingot where the continuous vertical laser irradiation provided separation region 101A as illustrated in FIG. 12.

Figure 13:
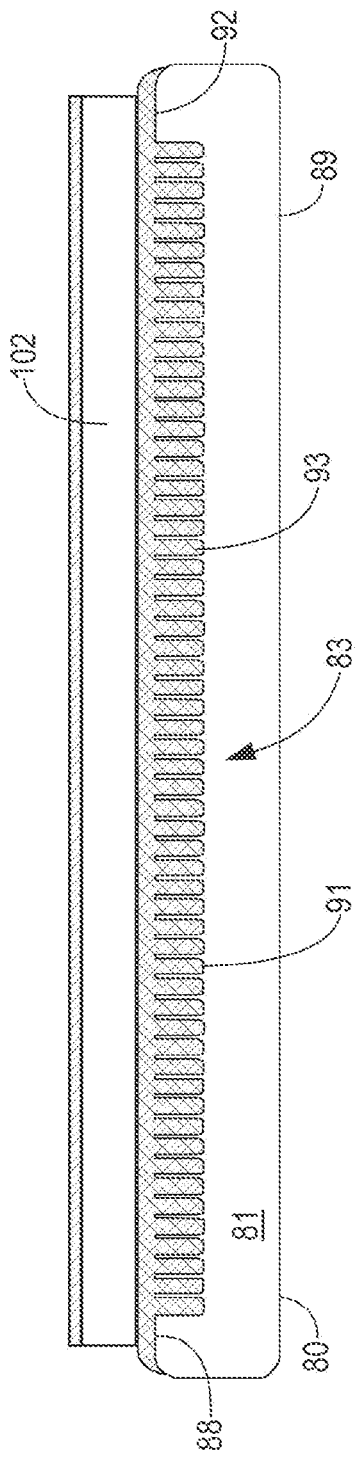
FIG. 13 illustrates a cross-sectional view of the semiconductor structure of FIG. 12 after additional processing in accordance with the present description.
Figure 14:
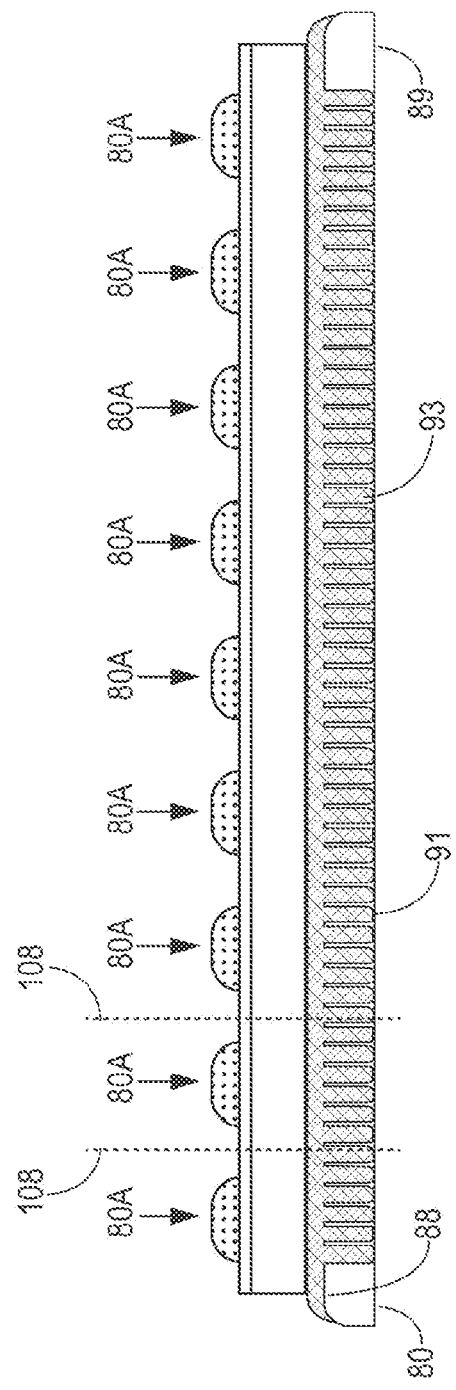
FIG. 14 illustrates a cross-sectional view of the semiconductor structure of FIG. 13 and further processing in accordance with the present description.

FIG. 13 illustrates semiconductor structure 80 after additional processing. In some examples, part of the top side of region of SiC material 102 is removed including separation region 101A. In some examples, grinding or CMP techniques can be used for the removal step. At this stage of fabrication, semiconductor structure 80 can be further processed in accordance with standard wafer processing techniques to provide individual semiconductor components 80A across semiconductor structure 80 as illustrated in FIG. 14. Such wafer processing techniques can form individual doped regions in region of SiC material 102, can form isolation regions, can form dielectrics, and can form contacts. In accordance with the present description, part of substrate 81 can be removed from major surface 89 to expose lower sides of filled recessed structure 83 including portions of fill material 93. When fill material 93 is doped, fill material 93 can provide a contact region to each of the semiconductor components 80A when semiconductor components 80A are singulated to provide individual components. In some examples, such contact regions can be current carrying electrodes when semiconductor components 80A comprise vertical devices. In other examples, fill material 93 is not exposed and a portion of substrate 81 remains adjacent to the lower surfaces of trenches 91. In some examples, semiconductor components 80A comprises power semiconductor devices. Singulation lines 108 are an example of where semiconductor components 80A can be separated into individual devices.

In accordance with the present description, filled recess structure 83 is configured to reduce the stresses between region of SiC material 102 and substrate 11 thereby reducing defects, such as delamination between the materials even at higher process temperatures used for SiC device manufacturing.

It is understood that although silicon has been described as an example substrate material and the structured formed onto the substrate is describes as SiC, the present description is relevant to other materials including other heterojunction semiconductor materials, such as SiGe, SiGeC, GaAs, InGaP, GaN, and AN, for the substrate or the fill material.

In view of all of the above, it is evident that a novel structure and method are disclosed. Included, among other features, is a substrate having a filled recessed structure and another structure stacked or provided over the filled recessed structure. In some examples, the substrate has a first CTE, the filled recessed structure comprises a fill material within recesses that a second CTE, and the structure has a third CTE. In some examples, the second CTE is selected to be between the first CTE and the third CTE. The filled recessed structure is configured to reduce stresses between the structure and the substrate thereby improving yields and reliability. In some examples, the structure comprises a MIM capacitor. In other examples, the fill material and the structure comprise one or more heterojunction semiconductor materials. For example, the structure can comprise a region of SiC material and the substrate can comprise silicon.

While the subject matter of the invention is described with specific preferred examples, the foregoing drawings and descriptions thereof depict only typical examples of the subject matter and are not therefore to be considered limiting of its scope. It is evident that many alternatives and variations will be apparent to those skilled in the art. For example, the fill materials can comprise combinations of materials that may be deposited individually and annealed deposited as a plurality of layers and annealed as a composite structure. Various deposition techniques can be used for the fill materials, including sputtering, plating, evaporation, CVD, LPCVD, PECVD, MOCVD, ALD as well as other deposition techniques known to one of ordinary skill in the art.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some, but not other features included in other examples, combinations of features of different examples are meant to be within the scope of the invention and meant to form different examples as would be understood by those skilled in the art.

What is claimed is:

1. A method of manufacturing an electronic device, comprising:
   providing a work piece comprising a first material, a first side, a second side opposite to the first side, and a first coefficient of thermal expansion (a first CTE);
   providing recesses extending into the work piece from the first side and comprising a pattern;
   providing a second material comprising a second CTE within the recesses and over the first material between the recesses; and
   providing a third material comprising a third CTE over one of the second side or the second material;
   wherein:
      the third CTE and the second CTE are different than the first CTE.

2. The method of claim 1, wherein:
providing the recesses comprises providing the pattern comprising a honeycomb pattern.

3. The method of claim 1, wherein:
providing the third material comprises providing an insulating packaging material.

4. The method of claim 1, wherein:
providing the second material comprises providing an insulating material.

5. The method of claim 1, wherein:
providing the first material comprises providing a semiconductor material.

6. The method of claim 1, wherein:
providing the third material comprising providing the third material over the second material.

7. The method of claim 1, wherein:
providing the third material comprises providing the third material over the second side of the work piece.

8. The method of claim 1, wherein:
the third CTE and the second CTE are greater than the first CTE.

9. The method of claim 1, wherein:
the second CTE is greater than the first CTE and less than the third CTE.

10. A method of manufacturing an electronic device, comprising:
   providing a work piece comprising a first material, a first side, and a second side opposite to the first side, the first material comprising a first coefficient of thermal expansion (a first CTE);
   providing a filled recessed structure comprising:
      recesses extending into the first material and comprising a pattern in a plan view, and
      a second material different than the first material in the recesses and comprising a second CTE; and
   providing a third material over one of the second material or the second side and comprising a third CTE, wherein:
   the third CTE and the second CTE are different than the first CTE; and
   each of the recesses comprises a polygonal shape in a top view.

11. The method of claim 10, wherein:
the third CTE and the second CTE are greater than the first CTE.

12. The method of claim 10, wherein:
the second CTE is greater than the first CTE and less than the third CTE.

13. The method of claim 10, wherein:
providing the filled recessed structure comprises providing the second material extending out of the recesses and overlapping the first material interposed between the recesses.

14. The method of claim 10, wherein:
providing the third material comprises providing the third material over the second material.

15. The method of claim 10, wherein:
providing the third material comprises providing the third material over the second side of the work piece.

16. The method of claim 10, wherein:
providing the second material comprises providing the second material comprising one or more of GaN, AlN, or InGaP.

17. A method of manufacturing an electronic device, comprising:
   providing a work piece comprising a first material, a first side, a second side opposite to the first side, and a first coefficient of thermal expansion (a first CTE);
   providing recesses extending into the work piece from the first side and comprising a pattern;
   providing a second material within the recesses and over portions of the first material outside of the recesses and interposed between the recesses, wherein the second material comprises a second CTE; and
   providing a third material over one of the second side or the second material, wherein the third material comprises a third CTE;
   wherein:
      the third CTE and the second CTE are different than the first CTE.

18. The method of claim 17, wherein:
providing the first material comprises providing the first material comprising silicon carbide (SiC).

19. The method of claim 17, wherein:
providing the second material comprises providing an insulating material; and
providing the third material comprising providing the third material over the second side of the work piece.

20. The method of claim 17, wherein:
providing the third material comprises providing the third material over the second material;
providing the second material comprises providing a dielectric; and
providing the third material comprises providing an insulating packaging material.

* * * * *